United States Patent
Chang et al.

(10) Patent No.: US 7,724,063 B1
(45) Date of Patent: May 25, 2010

(54) INTEGRATOR-BASED COMMON-MODE STABILIZATION TECHNIQUE FOR PSEUDO-DIFFERENTIAL SWITCHED-CAPACITOR CIRCUITS

(75) Inventors: Soon-Jyh Chang, Tainan (TW); Jin-Fu Lin, Tainan (TW); Chih-Haur Huang, Tainan (TW)

(73) Assignees: Himax Media Solutions, Inc., Tainan County (TW); NCKU Research and Development Foundation, Tainan County (TW)

( * ) Notice: Subject to any disclaimer, the term of this patent is extended or adjusted under 35 U.S.C. 154(b) by 0 days.

(21) Appl. No.: 12/326,854

(22) Filed: Dec. 2, 2008

(51) Int. Cl.
  *H03F 1/02* (2006.01)
(52) U.S. Cl. .............................. 327/337; 327/554; 330/9
(58) Field of Classification Search ......... 327/551–559, 327/94, 336–337; 333/9; 330/9
  See application file for complete search history.

(56) References Cited

U.S. PATENT DOCUMENTS

| | | | |
|---|---|---|---|
| 4,599,573 A * | 7/1986 | Senderowicz | 330/107 |
| 5,391,999 A * | 2/1995 | Early et al. | 327/337 |
| 6,573,785 B1 * | 6/2003 | Callicotte et al. | 330/9 |
| 6,940,348 B2 * | 9/2005 | Confalonieri et al. | 330/69 |

* cited by examiner

*Primary Examiner*—Dinh T. Le
(74) *Attorney, Agent, or Firm*—Stout, Uxa, Buyan & Mullins, LLP

(57) ABSTRACT

A pseudo-differential switched-capacitor circuit using integrator-based common-mode stabilization technique is disclosed. A pseudo-differential switched-capacitor circuit with the differential floating sampling (DFS) technique has a common-mode gain value of one (1). An integrator is electrically coupled to the differential positive/negative outputs of the DFS circuit, and the integrator feeds back integrator output to the DFS circuit by detecting common-mode voltage disturbance at the differential positive output ($V_{out}+$) and negative output ($V_{out}-$), thereby stabilizing output common-mode level of the differential positive output ($V_{out}+$) and negative output ($V_{out}-$) at a desirable level.

10 Claims, 7 Drawing Sheets

$$[(V_{cm}+\Delta V_{cm})-V_{cmi}]*2C=(V_{cm}-V_x)*C+(V_{cm}-V_x)*C$$
$$\Rightarrow V_x=V_{cmi}-\Delta V_{cm}$$

INTEGRATOR-BASED COMMON-MODE STABILIZATION TECHNIQUE FOR PSEUDO-DIFFERENTIAL SWITCHED-CAPACITOR CIRCUITS

BACKGROUND OF THE INVENTION

1. Field of the Invention

The present invention generally relates to pseudo-differential switched-capacitor circuits, referred to as an integrator-based common-mode stabilization technique.

2. Description of the Prior Art

High-precision switched-capacitor circuits require high-gain and high-linearity amplifiers, which dominate the performance of the switched-capacitor circuits. The modern process tends toward low operating voltage to improve the circuit performance. This tendency leads to limited signal range and thus the design complexity. Further, the amplifiers may consume more power in order to maintain the signal-to-noise ratio.

Fully differential amplifier 10, as shown in FIG. 1A, is conventionally used to increase noise-immunity and signal swing. A common-mode feedback circuit (CMFB) 102 is required in the fully differential amplifier 10 to stabilize its output common-mode voltage (at the output node Out+/Out−). As the circuit's total current is controlled by a tail current metal-oxide-semiconductor (MOS) transistor Mc1, the common-mode disturbance at the input node In +/In− will not affect the circuit performance. The fully differential amplifier 10 therefore has high common-mode rejection ratio (CMRR). However, the transistor Mc1 disadvantageously limits the output signal range, and thus is unfavorable for low operating-voltage process. In order to enlarge the output signal range, a pseudo-differential amplifier 12, as shown in FIG. 1B, is conventionally used. The pseudo-differential amplifier 12 eliminates the tail current MOS transistor Mc1 of FIG. 1A, at the cost of losing common-mode noise-immunity. Accordingly, the input common-mode noise (at the input node In+/In−) will be amplified by the pseudo-differential amplifier 12, thereby degrading the circuit performance. The operations of the fully differential amplifier 10 and the pseudo-differential amplifier 12 are demonstrated in the following paragraphs in turn.

FIG. 2 schematically illustrates the operation of a switched-capacitor circuit 20 using the fully differential amplifier 104. In the illustration, only the common-mode voltage disturbance ($\Delta V_{cm}$) is considered while ignoring other alternating-current (AC) signals. In the sample phase, as shown in the left hand of the figure, the common-mode voltage disturbance ($\Delta V_{cm}$) is sampled by two capacitors C. In the amplify phase, as shown in the right hand of the figure, the output common-mode voltage can be maintained at $V_{cm}$ due to the common-mode feedback circuit (CMFB). According to the conservation of charge, the common-mode voltage $V_x$ at the input node of the amplifier 104 can be derived as shown in the figure. The input common-mode voltage disturbance ($\Delta V_{cm}$) will be reflected into the input common-mode voltage $V_x$. Nevertheless, the amplifier 104 can tolerate the common-mode voltage disturbance ($\Delta V_{cm}$) whenever the amplifier 104 has sufficient input common-mode range.

FIG. 3 schematically illustrates the operation of a switched-capacitor circuit 30 using the pseudo-differential amplifier 124. As the pseudo-differential amplifier 124 does not use any common-mode feedback circuit (CMFB), the output voltage thus cannot be controlled at a desirable level, and the circuit 30 generates common-mode gain of two (2) with respect to the input common-mode voltage disturbance ($\Delta V_{cm}$), where the common-mode gain is equal to the differential mode gain. When the circuit 30 is applied, for example, to the cascaded stages of a pipelined analog-to-digital converter, as shown in FIG. 4, the common-mode gain of two (2) in each stage will probably make the later stage(s) saturated, causing the converter to malfunction. The pipelined analog-to-digital converter mentioned above is discussed in another patent application entitled "Stage-Resolution Scalable Opamp-Sharing Technique for Pipelined/Cyclic ADC" owned by the same assignee of the present application, the disclosure of which is hereby incorporated by reference.

The pseudo-differential switched-capacitor circuit as discussed above needs an effective mechanism to stabilize the common-mode voltage in order to keep sufficient signal swing for a low operating-voltage process. There are some techniques disclosed in the scientific/technical literature, which are discussed in the following paragraphs.

1. Common-Mode Feedback Circuit (CMFB)

The common-mode feedback circuit (CMFB) is the most direct answer to stabilizing the output common-mode voltage. FIG. 5 shows a pseudo-differential switched-capacitor circuit 50 (which is the equivalent of the amplify-phase circuit 30 in FIG. 3) using the CMFB 102, which keeps the output common-mode level at a desirable common-mode voltage ($V_{cm}$). Owing to the lack of tail current transistor, the common-mode voltage disturbance ($\Delta V_{cm}$) at the input node will disadvantageously result in current change in the circuit 50, thereby degrading the circuit performance in accordance with the input common-mode voltage disturbance ($\Delta V_{cm}$).

2. Differential Floating Sampling Scheme (DFS)

For the pseudo-differential switched-capacitor circuit, in the sample phase, the common-mode voltage disturbance ($\Delta V_{cm}$) is sampled by two capacitors, or equivalently speaking, common-mode voltage disturbance $\Delta V_{cm}$, provided that the two capacitors have the same capacitance C, is sampled by the two capacitors, resulting in common-mode gain of two (2). It may be possible to decrease the common-mode gain to relieve the effect of the common-mode voltage disturbance on the circuit, by decreasing the degree of sampling the common-mode voltage disturbance ($\Delta V_{cm}$). This goal can be obtained, for example, by applying a differential floating sampling scheme (DFS) as shown in FIG. 6, which is disclosed, for example, in J. Li and U. K. Moon, "A 1.8-V 67-mW 10-bit 100 MS/s pipelined ADC using time-shifted CDS technique," *IEEE J. Solid-State Circuits*, vol. 39, pp. 1468-1476, September 2004, the disclosure of which is hereby incorporated by reference. The circuit 60 in FIG. 6 uses two single-ended amplifiers in the positive and negative path respectively, and has a pseudo-differential architecture similar to that in FIG. 3. In the sample phase (with active ψ1), the upper plates (connected to the input nodes of the amplifiers 602A/602B) of the capacitor C1 and the capacitor C4 receive common-mode voltage (via ψ1-controlled switches), while the upper plates of the capacitor C2 and the capacitor C3 are floating (due to floating switch surrounded by the dash rectangular). The capacitor C1 or the capacitor C4 will sample the common-mode voltage disturbance ($\Delta V_{cm}$) to get the common-mode voltage disturbance charge (1xCx $\Delta V_{cm}$), but the floating capacitor C2 or the capacitor C3 will bypass the input common-mode disturbance. Accordingly, the common-mode gain of the circuit 60 has a value of one (1), and the input common-mode voltage disturbance will not be amplified. The circuit 60 according to the differential floating sampling scheme (DFS) needs no additional active circuit, such as the CMFB, and may substantially improve its power consumption. However, the switches of the circuit 60 disadvantageously give rise to charge injection effect, which makes additional common-mode voltage drift. When the circuit 60 is applied, for example, to the cascaded stages of a pipelined analog-to-digital converter, as shown in FIG. 4, the later stage(s) probably possesses large common-mode voltage drift, therefore decreasing the circuit performance.

3. Common-Mode Feed-forward Scheme (CMFF)

FIG. 7A shows a circuit 70 according to common-mode feed-forward scheme (CMFF), which has a stabilization concept similar to that in FIG. 6, but can further reduce the common-mode gain toward zero (0). FIG. 7A to FIG. 7C are disclosed, for example, T. Ueno, T. Ito, et al., "A 1.2 V, 24 mW/ch, 10 bit, 80 M Sample/s pipelined A/D converters," *Proc. Of CICC*, pp. 501-504, September 2006, the disclosure of which is hereby incorporated by reference. The circuit utilizes a common-mode (CM) detector 702 to detect input common-mode voltage, and then utilizes an analog adder/subtractor 704 to make the common-mode voltage disturbance to be reflected onto the upper plate of the capacitor. As a result, no common-mode voltage disturbance ($\Delta V_{cm}$) will be sampled, and the circuit 70 thus has no common-mode gain, thereby effectively eliminating the common-mode voltage drift. However, the circuit 70 still has the common-mode voltage drift due to the charge injection effect caused by associated switches.

FIG. 7B shows a detailed circuit of the common-mode (CM) detector 702 in FIG. 7A, and FIG. 7C shows a detailed circuit of the analog adder/subtractor 704 in FIG. 7A. The analog adder/subtractor 704 is two-stage amplifier, which the first stage has a four-input single-ended amplifier 7041, and the second stage 7042 is a common source amplifier. The analog adder/subtractor 704 uses Miller compensation technique to accomplish its frequency compensation. The output of the circuit 704 is connected to the input as an amplifier with gain of one (1). As the CMFF circuit 70 does not utilize feedback control to decrease the common-mode voltage, the finite gain error and the settling error of the analog adder/subtractor 704 will still be amplified by the circuit 70. In order to decrease the common-mode voltage disturbance, the open-circuit gain and the bandwidth of the analog adder/subtractor 704 should both be increased, which advantageously consume more power.

Due to the disadvantages of the prior techniques for the common mode stabilization of the peudo-differential switched-capacitor circuits, a need has arisen to propose an innovative technique that could effectively decrease the common-mode voltage drift due to the charge injection effect caused by associated switches.

SUMMARY OF THE INVENTION

In view of the foregoing, it is an object of the present invention to provide a common-mode stabilization technique, particularly an integrated-based technique, for pseudo-differential switched-capacitor circuit, such that the common-mode voltage drift due to the charge injection effect caused by associated switches can be substantially improved.

According to one embodiment, a differential floating sampling (DFS) technique is employed to make the pseudo-differential architecture with unity common-mode gain, which only bypasses the input common-mode disturbance to the output of the switched-capacitor circuit. Therefore, the input common-mode disturbance and the common-mode error caused by the switch charge injection can be sensed at the output of the switched-capacitor circuit. An integrator is employed to sense the total output common-mode disturbance and feed back its output cmi to the switched-capacitor circuit with the DFS technique. thereby stabilizing output common-mode level at a desirable level. Specifically, during the amplify phase (ψ2), the integrator detects common-mode voltage disturbance at the differential positive output ($V_{out}+$) and negative output ($V_{out}-$). During the sample phase (ψ1), the integrator performs integration and feeds the output of the integrator amplifier back to the switched-capacitor circuit, thus forming a common-mode negative feedback loop to adjust the differential positive output ($V_{out}+$) and negative output ($V_{out}-$).

DETAILED DESCRIPTION OF THE INVENTION

Figure 8:
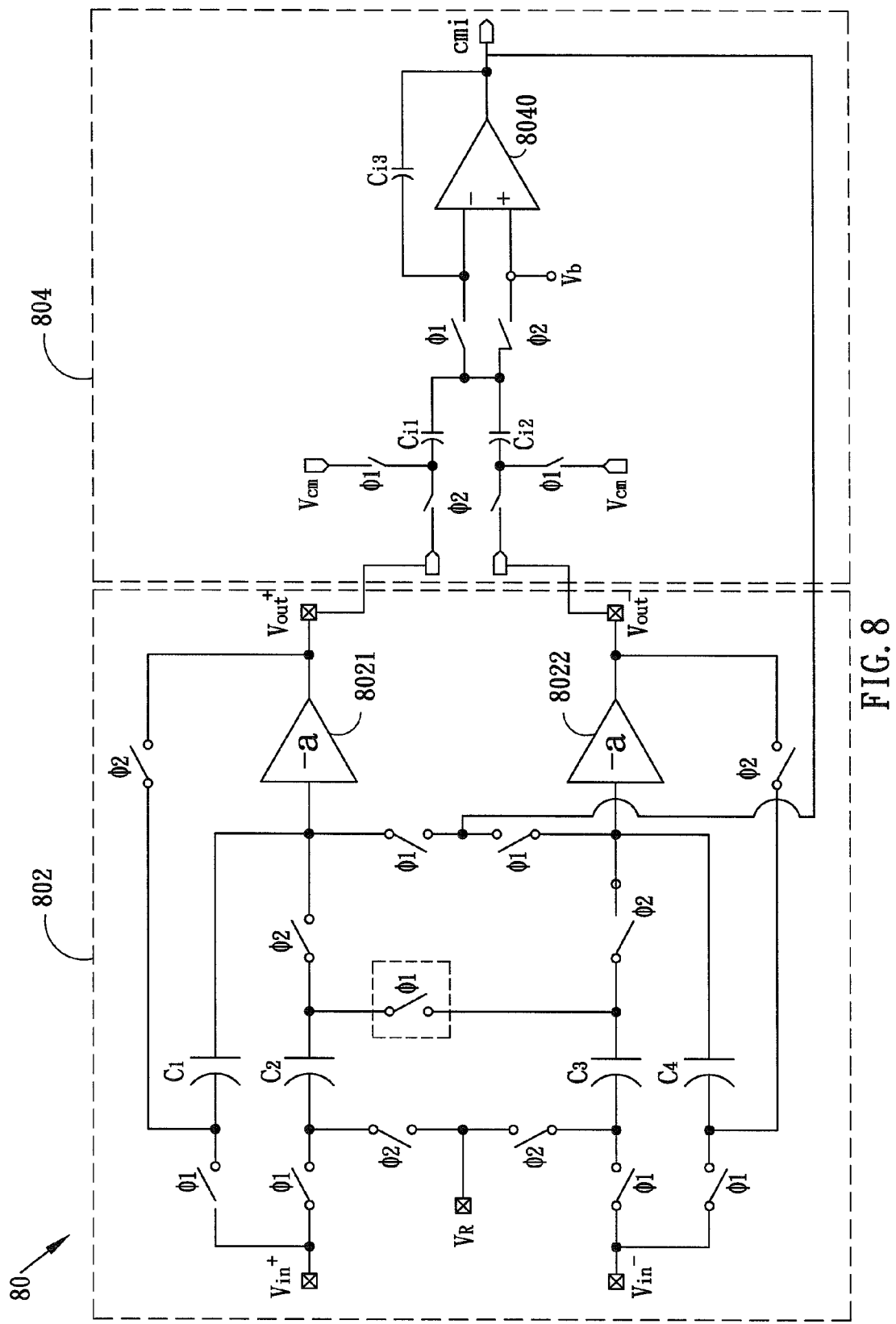
FIG. 8 illustrates a pseudo-differential switched-capacitor circuit using an integrator-based common-mode stabilization technique (IB-CMS) according to one embodiment of the present invention.

FIG. 8 illustrates a pseudo-differential switched-capacitor circuit 80 using an integrator-based common-mode stabilization technique (IB-CMS) according to one embodiment of the present invention. In the embodiment, the circuit 80 includes a peusdo-differential switched-capacitor circuit with the differential floating sampling (DFS) technique 802 and an integrator 804. In the figure, the control signal ψ1 represents the sample-phase control signal, that is, an active ψ1 indicates that the circuit 80 are under sampling. The other control signal ψ2 represents the amplify-phase control signal, that is, an active ψ2 indicates that the circuit 80 are under amplifying. In general, the sample-phase control signal ψ1 and the amplify-phase control signal ψ2 are, but not limited to, non-overlapped square waves.

The pseudo-differential switched-capacitor circuit with the differential floating sampling (DFS) technique 802, in the embodiment, includes a positive path and a negative path. In the positive path, the input node of a first single-ended amplifier 8021 is electrically coupled to first ends of a first capacitor C1 and a second capacitor C2, which are electrically connected in parallel. In the specification, the term "electrically" coupled or connected means that two elements/nodes are either directly connected through conductive wire or are indirectly connected via switch(s), and may be understood in context with the associated figure and description. The output node of the first amplifier 8021 provides the positive output $V_{out}+$. The two ends of the first capacitor C1 and the second capacitor C2 are electrically connected to the positive input $V_{in}+$. The first capacitor C1 is electrically connected between the positive input $\backslash V_{in}+$ and the input node of the first amplifier 8021 via the ψ1 and ψ2 controlled switches in the following manner: in the sample phase, the first capacitor C1 is directly connected between the positive input $V_{in}+$ and the output node of the integrator 804 cmi; in the amplify phase, the bottom plate of the first capacitor C1 is connected to the positive output voltage $V_{out}+$, and the top plate of the first capacitor C1 is disconnected to the output node of the integrator 804 cmi. The second capacitor C2 is electrically connected between the positive input $V_{in}+$ and the input node of the first amplifier 8021 via the ψ1 and ψ2 controlled switches in the following manner: in the sample phase, the bottom plate of the second capacitor C2 is connected to the positive input $V_{in}+$ and the upper plate of the second capacitor C2 is floating, which means no DC path at this node; in the amplify phase, the bottom plate of the second capacitor C2 is connected to a reference voltage $V_R$ and the upper plate of the second capacitor C2 is connected to the input node of the first amplifier 8021.

In the negative path, a second single-ended amplifier 8022, a third capacitor C3 and a fourth capacitor C4 are connected in a manner similar to that of the first single-ended amplifier 8021, the second capacitor C2 and the first capacitor C1 as discussed above. That is, the second single-ended amplifier 8022 configures similarly as the first single-ended amplifier 8021 does, the third capacitor C3 configures similarly as the second capacitor C2 does, and the fourth capacitor C4 configures similarly as the first capacitor C1 does. The connections of the above-mentioned elements are summarized in the following Table 1.

TABLE 1

|  | Sample phase | Amplify phase |
| --- | --- | --- |
| C1 | between $V_{in}+$ and cmi | bottom to $V_{out}+$; upper to 1st amplifier input |
| C2 | bottom to $V_{in}+$; upper floating | bottom to $V_R$; upper to 1st amplifier input |
| C3 | bottom to $V_{in}-$; upper floating, and to C2's upper | Bottom to $V_R$; upper to 2nd amplifier input |
| C4 | between $V_{in}-$ and cmi | bottom to $V_{out}-$; upper to 2nd amplifier input |

Figures 1A, 1B:
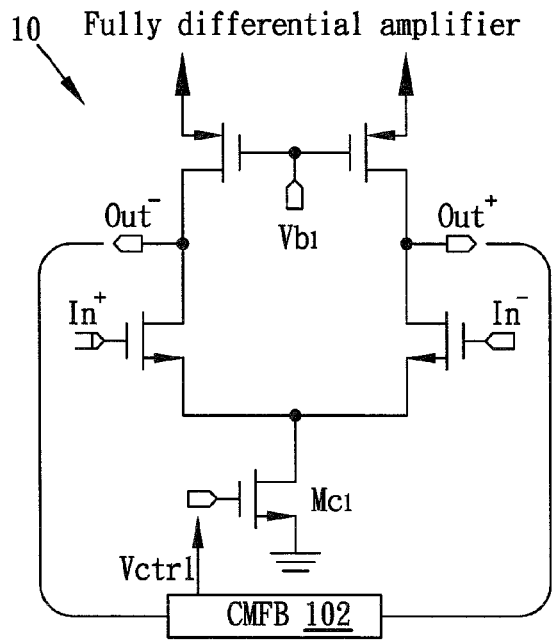
FIG. 1A shows a conventional fully differential amplifier.
FIG. 1B shows a conventional pseudo-differential amplifier.
Figure 2:
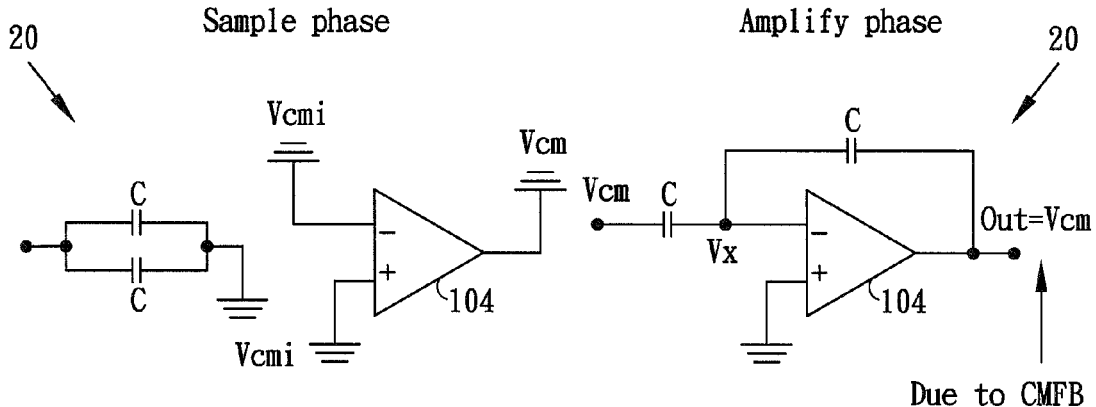
FIG. 2 schematically illustrates the operation of a switched-capacitor circuit using the fully differential amplifier.
Figure 3:
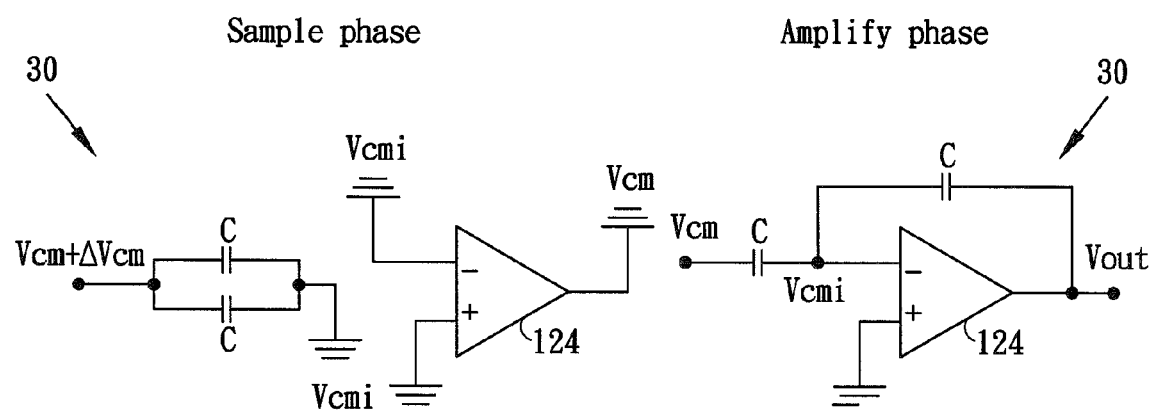
FIG. 3 schematically illustrates the operation of a switched-capacitor circuit using the pseudo-differential amplifier.
Figure 4:
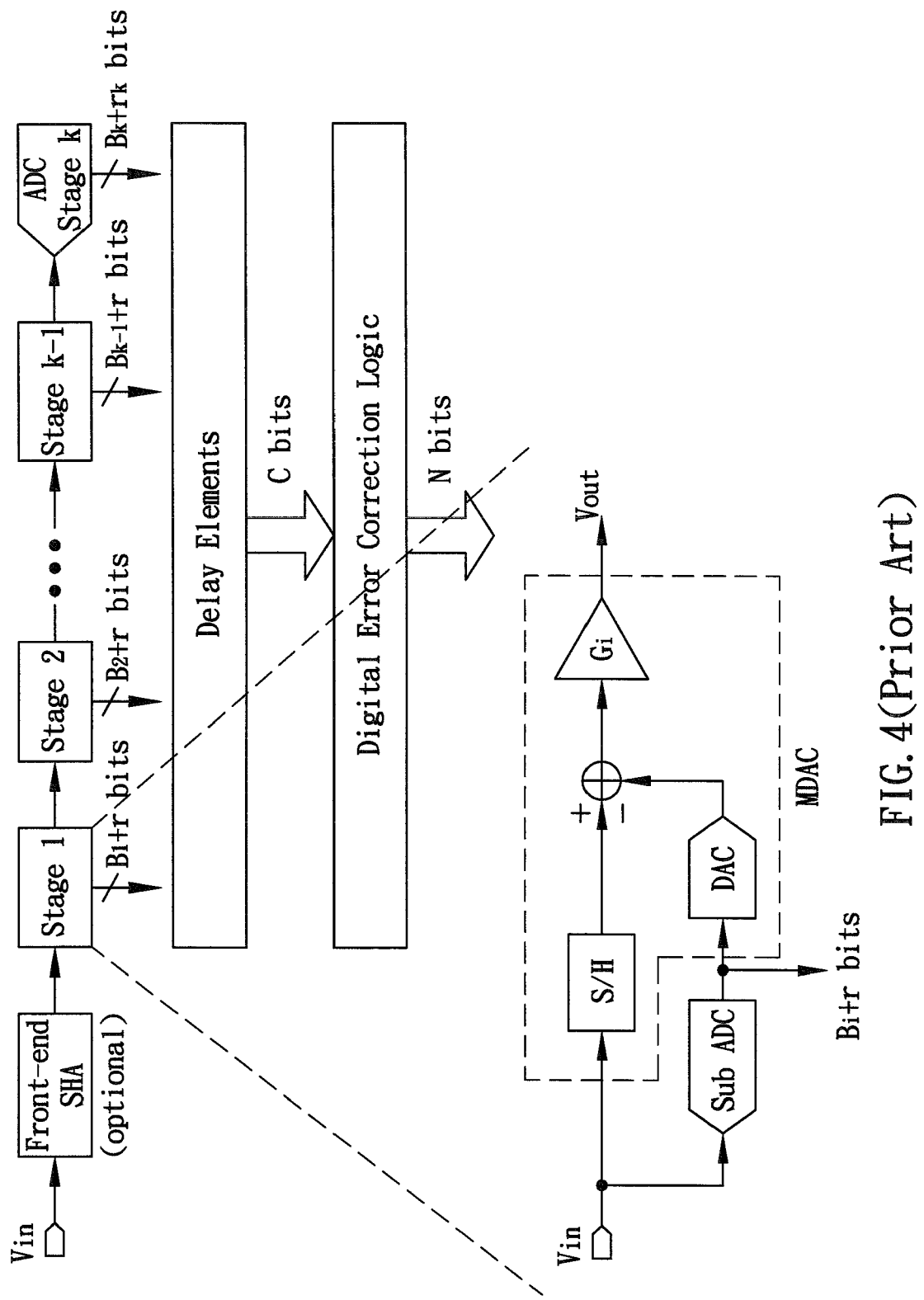
FIG. 4 shows a conventional pipelined analog-to-digital converter.
Figure 5:
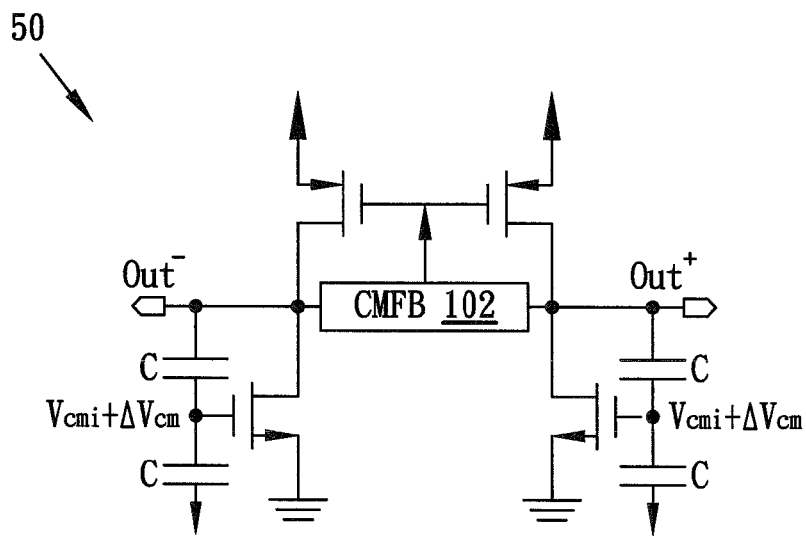
FIG. 5 shows a pseudo-differential switched-capacitor circuit using the CMFB.
Figure 6:
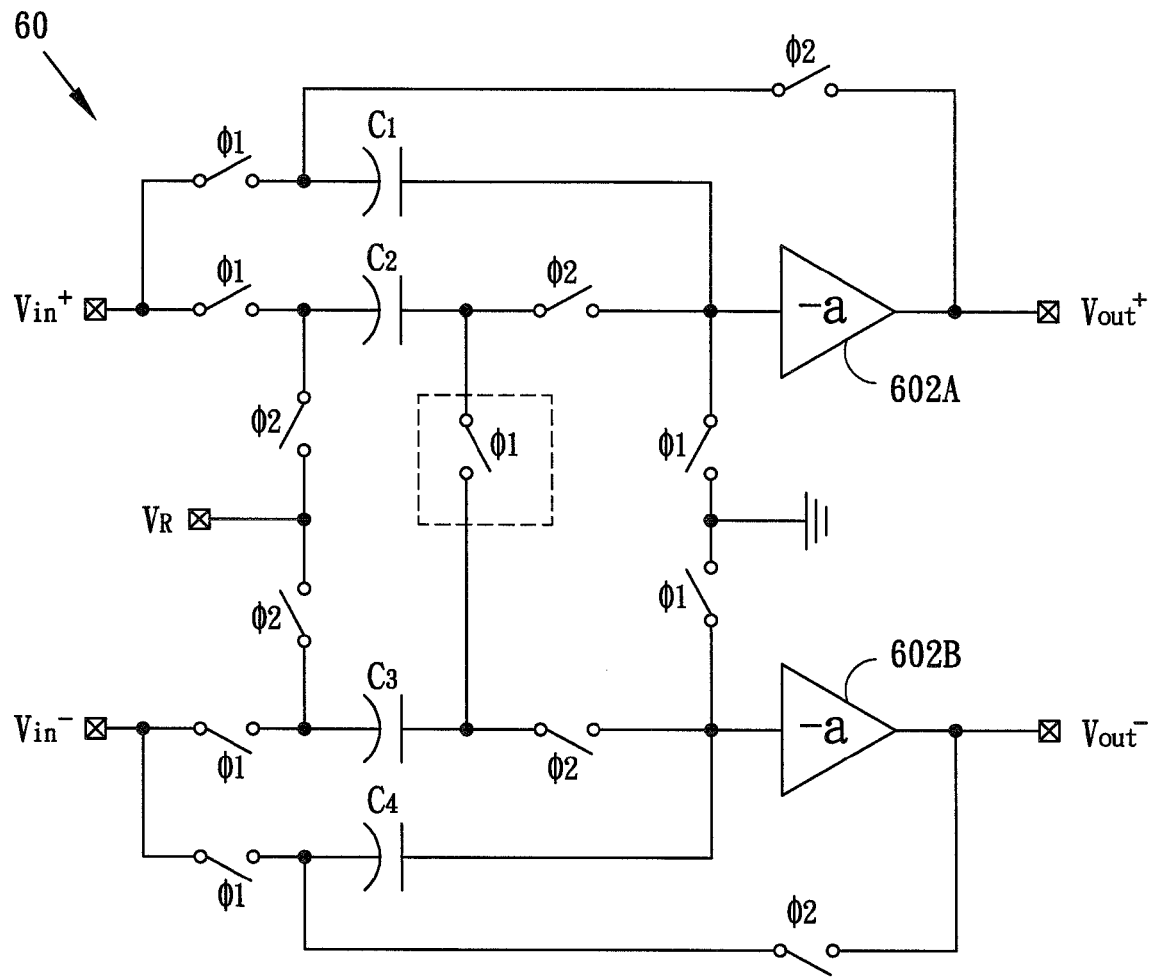
FIG. 6 shows a circuit according to differential floating sampling scheme.

In brief, in the sample phase (with active ψ1), the capacitor C1 and the capacitor C4 sample the input common-mode disturbance (via ψ1-controlled switches), while the upper plates of the capacitor C2 and the capacitor C3 are floating (due to floating switch surrounded by the dash rectangular). The capacitor C1 or the capacitor C4 will sample the common-mode voltage disturbance ($\Delta V_{cm}$) to get the common-mode voltage disturbance charge ($1 \times C \times \Delta V_{cm}$), but the floating capacitor C2 or the capacitor C3 will sample no charge. Accordingly, the common-mode gain of the circuit 80 has a value of one (1), and the input common-mode voltage disturbance will not be amplified. The DFS circuit 802, similar to the circuit 60 (FIG. 6), needs no additional active circuit, such as the CMFB, and may improve its power consumption. However, as discussed above regarding FIG. 6, the switches give rise to charge injection effect, which makes additional common-mode voltage drift, and decreases circuit performance.

The integrator 804, which is configured as a non-inverted integrator in the embodiment, is utilized to overcome the charge injection effect. The integrator 804 has two inputs, which are respectively coupled to the outputs Vout+ and Vout− of the DFS circuit 802 electrically. The negative input node of an integrator amplifier 8040 is electrically coupled, via ψ1-controlled switch, to parallel-connected sample capacitors $C_{i1}$ and $C_{i2}$, and the positive input node of the amplifier 8040 receives an input bias $V_b$ and is electrically coupled, via ψ2-controlled switch, to parallel-connected sample capacitors $C_{i1}$ and $C_{i2}$. Further, the non-inverting input node is connected to output node (cmi) with an integrator capacitor C13. The output node (cmi) of the amplifier 8040 is coupled to the input node of the amplifiers 8021/8022 via ψ1-controlled switches.

In the integrator sampling phase (with active ψ2), the integrator 804 is coupled to the DFS circuit 802 via ψ2-controlled switches, and is used to detect the common-mode voltage disturbance at the output node $V_{out}+$ and $V_{out}-$, which contains the input common-mode disturbance and the common-mode error induced by the charge injection in the DFS circuit. In this phase, the bottom plates of the capacitors $C_{i1}$ and $C_{i2}$ are connected to the DFS circuit 802, while the upper plates of the capacitors C11 and C12 are connected to the positive input node of the amplifier 8040. In the integrating phase (with active ψ1), the bottom plates of the capacitors $C_{i1}$ and $C_{i2}$ are connected to common-mode voltage $V_{cm}$ which is the desired output common-mode voltage of the DFS circuit, and the upper plates are connected together to the (negative) input node of the amplifier 8040. In this phase, the integrator 804 performs the common-mode disturbance integration, and feeds the output voltage cmi back to the upper plates of the capacitors $C_1$ and $C_4$, thus forming a common-mode negative feedback loop. As the integrator 80 is capable of accumulating charge, the integrator 80 thus can gradually adjust the output voltage $V_{out}+/V_{out}-$, thereby stabilizing the output common-mode level at a desirable level. The connections of the above-mentioned elements are summarized in the following Table 2.

TABLE 2

|  | Integrating phase (active ψ 1) | integrator sampling phase (active ψ 2) |
| --- | --- | --- |
| $C_{i1}$ | bottom to $V_{cm}$; upper to amplifier − input | bottom to DFS; upper to amplifier + input |
| $C_{i2}$ | bottom to $V_{cm}$; upper to amplifier − input | bottom to DFS; upper to amplifier + input |

In designing the integrator 804, some guidelines may be followed:

1. The sample capacitors $C_{i1}/C_{i2}$ and the integrator capacitor C13 should be properly selected, such that the integrator 80 can be sufficiently stable. In general, the sample capacitors $C_{i1}/C_{i2}$ should have value less than the integrator capacitor $C_{i3}$.
2. As the gain of the amplifier 8040 affects the common-mode voltage at the output $V_{out}+/V_{out}-$, the smaller the gain is, the greater the common-mode error (or noise) is. In practice, according to one simulation, an amplifier with gain of 20 dB causes output common-mode error of 30 mV, which is mostly tolerable. When the feedback control scheme disclosed above is applied, for example, to each of cascaded circuit stages, we can use a single-stage amplifier to implement the integrator 804 provided that the common-mode error in each stage is controllably comparable to the error caused by the integrator amplifier 8040.

Figure 7A:
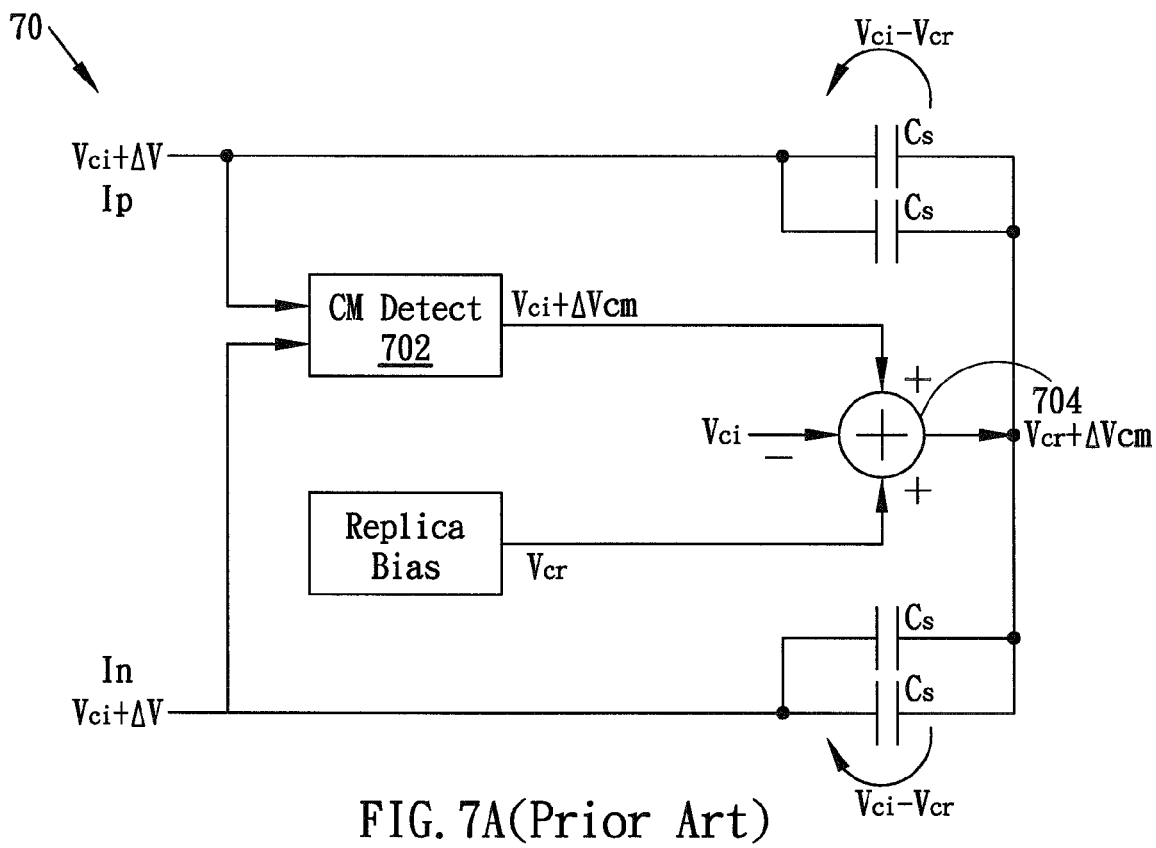
FIG. 7A shows a circuit according to common-mode feed-forward scheme.
Figure 7B:
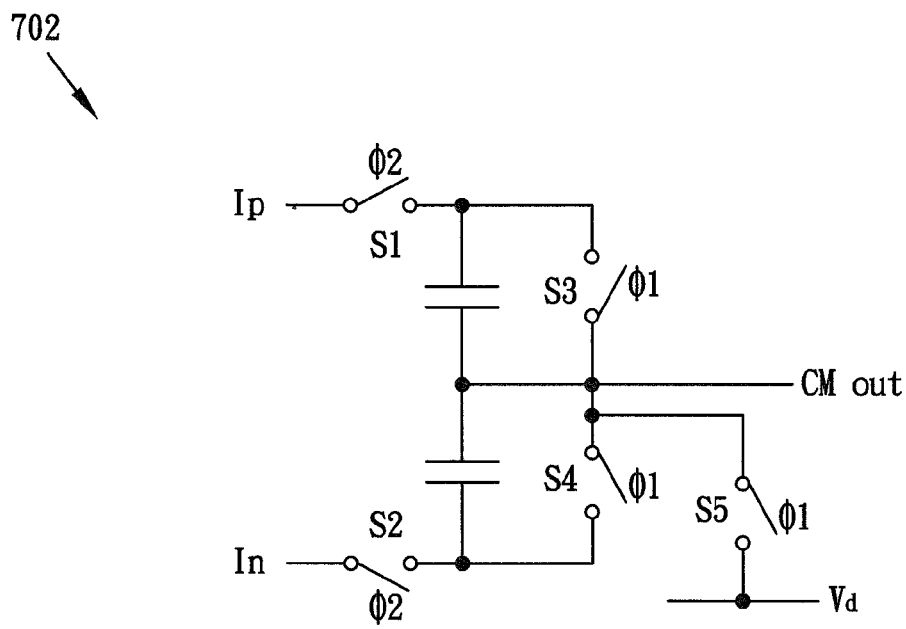
FIG. 7B shows a detailed circuit of the common-mode (CM) detector in FIG. 7A.
Figure 7C:
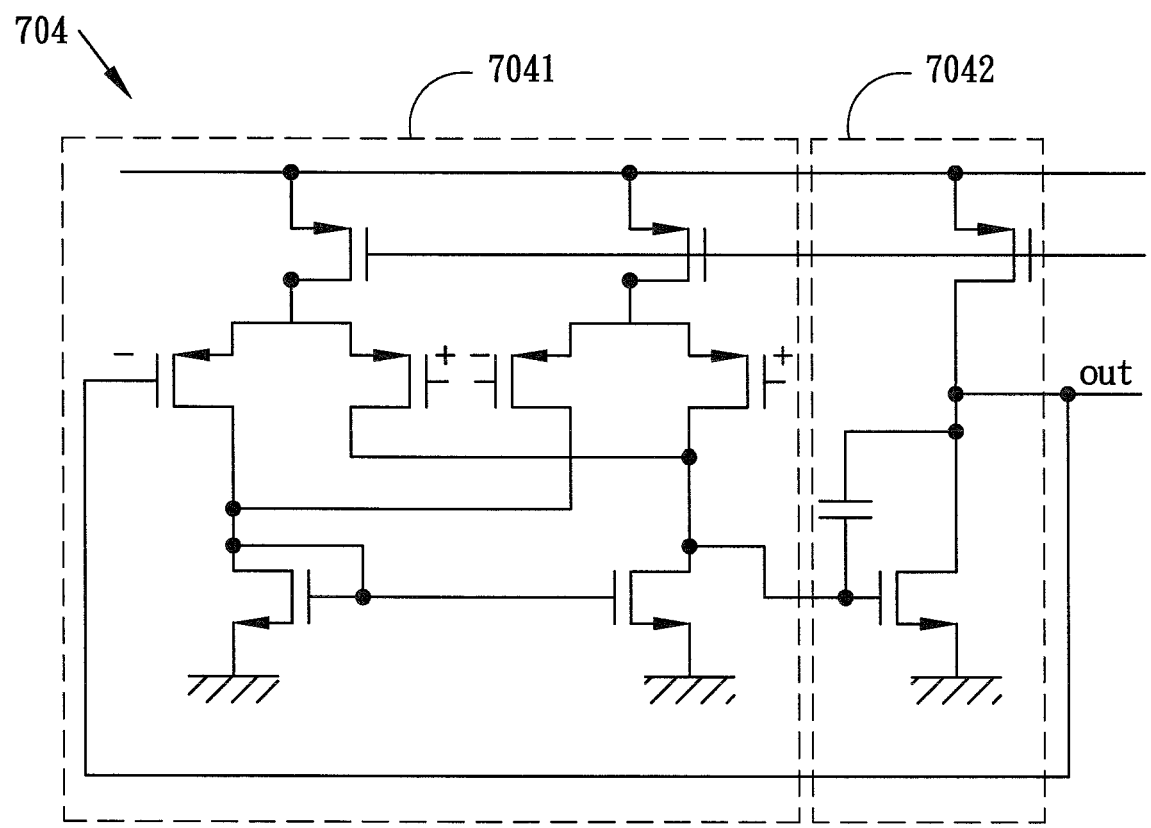
FIG. 7C shows a detailed circuit of the analog adder/subtractor in FIG. 7A.

According to the embodiment, the additional integrator 804 may be implemented merely by a single-stage, low-gain and low-power amplifier. The integrator 804 consumes substantially less power than the analog adder/subtractor 704 of the CMFF circuit 70 (FIG. 7A). Moreover, only one capacitor samples the output of the integrator 804, compared to two capacitors that sample the output of the analog adder/subtractor 704 of the CMFF circuit 70 (FIG. 7A). Accordingly, the load and the power consumption of the integrator 804 can be substantially reduced. The embodiment thus can substantially improve the common-mode voltage drift due to the charge injection effect caused by associated switches.

Although specific embodiments have been illustrated and described, it will be appreciated by those skilled in the art that various modifications may be made without departing from the scope of the present invention, which is intended to be limited solely by the appended claims.

What is claimed is:

1. A pseudo-differential switched-capacitor circuit, comprising:
   a differential floating sampling (DFS) circuit that has a pseudo-differential architecture with a common-mode gain value of one (1), said DFS circuit having a differential positive input ($V_{in}+$) and a negative input ($V_{in}-$), and said DFS circuit having a first single-ended amplifier and a second single-ended amplifier, wherein the first single-ended amplifier has having a differential positive output ($V_{out}+$) and the second single-ended amplifier has a differential negative output ($V_{out}-$); and
   an integrator electrically coupled to the differential positive/negative outputs, the integrator controllably feeding back integrator output to inputs of the first single-ended amplifier and the second single-ended amplifier of the DFS circuit, and the integrator receiving common-mode voltage disturbance at the differential positive output ($V_{out}+$) and negative output ($V_{out}-$), thereby stabilizing output common-mode level of the differential positive output ($V_{out}+$) and negative output ($V_{out}-$) of the DFS circuit at a desirable level;
   wherein the integrator includes:
      an integrator amplifier having a positive input and a negative input;
      a first sample capacitor and a second sample capacitor which are connected in parallel; and
      an integrator capacitor which is connected between an output of the integrator amplifier and the negative input of the integrator amplifier;
      wherein the integrator amplifier is connected to the first and second sample capacitors via switches.

2. The pseudo-differential switched-capacitor circuit of claim 1, wherein the integrator is configured as a non-inverted integrator.

3. The pseudo-differential switched-capacitor circuit of claim 1, wherein the integrator performs integration and feeds the output of the integrator amplifier back to the DFS circuit during an integrating phase ($\psi1$), thus forming a common-mode negative feedback loop to adjust the differential positive output ($V_{out}+$) and negative output ($V_{out}-$).

4. The pseudo-differential switched-capacitor circuit of claim 3, wherein the integrator detects common-mode voltage disturbance at the differential positive output ($V_{out}+$) and negative output ($V_{out}-$) during an integrator sampling phase ($\psi2$).

5. The pseudo-differential switched-capacitor circuit of claim 4, wherein the integrator further includes integrate-phase ($\psi1$) controlled switches and sample-phase ($\psi2$) controlled switches.

6. The pseudo-differential switched-capacitor circuit of claim 5, wherein, during the integrating phase, the first and second sample capacitors are connected to common-mode voltage via the $\psi1$ controlled switches, and are connected to the negative input of the integrator amplifier via one of the $\psi1$ controlled switches.

7. The pseudo-differential switched-capacitor circuit of claim 6, wherein, during the integrator sampling phase, the first and second sample capacitors are respectively connected to the differential positive output ($V_{out}+$) and negative output ($V_{out}-$) via the $\psi2$ controlled switches, and are connected to the positive input of the integrator amplifier via one of the $\psi2$ controlled switches.

8. The pseudo-differential switched-capacitor circuit of claim 7, wherein the DFS circuit includes:
   a positive path including the first single-ended amplifier, a first capacitor and a second capacitor, wherein the first and second capacitors are electrically coupled in parallel; and
   a negative path including the second single-ended amplifier, a third capacitor and a fourth capacitor, wherein the third and fourth capacitors are electrically coupled in parallel;
   wherein the output of the integrator amplifier is connected to inputs of the first and second single-ended amplifiers via the $\psi1$ controlled switches, and the outputs of the first and second single-ended amplifiers respectively provide the differential positive output ($V_{out}+$) and negative output ($V_{out}-$).

9. The pseudo-differential switched-capacitor circuit of claim 8, wherein:
   the first capacitor is connected between the positive input ($V_{in}+$) and the output of the integrator in the integrator sampling phase, and in an amplify phase bottom plate of the first capacitor is connected to the positive output ($V_{out}+$); and
   the second capacitor is electrically connected between the positive input ($V_{in}+$) and the input of the first single-ended amplifier via the $\psi1$ and $\psi2$ controlled switches in the following manner: in the integrator sampling phase bottom plate of the second capacitor is connected to the positive input ($V_{in}+$) and an upper plate of the second capacitor is floating, and in the amplify phase the bottom plate of the second capacitor is connected to a reference voltage and the upper plate of the second capacitor is connected to the input node of the first singled-ended amplifier.

10. The pseudo-differential switched-capacitor circuit of claim 9, wherein:
   the fourth capacitor is connected between the positive input ($V_{in}+$) and the output of the integrator in the integrator sampling phase, and in the amplify phase bottom plate of the fourth capacitor is connected to the positive output ($V_{out}+$); and
   the third capacitor is electrically connected between the negative input (Vin−) and the input of the second single-ended amplifier via the $\psi1$ and $\psi2$ controlled switches in the following manner: in the integrator sampling phase bottom plate of the third capacitor is connected to the negative input (Vin−) and an upper plate of the third capacitor is floating, and in the amplify phase the bottom plate of the third capacitor is connected to the reference voltage and the upper plate of the third capacitor is connected to the input node of the second singled-ended amplifier.

* * * * *